July 28, 1970 H. J. TANCREDI 3,521,953

ADJUSTABLE SEPARATION WAFER CLAMP

Filed March 13, 1968 6 Sheets-Sheet 1

INVENTOR.
Henry J. Tancredi

BY John B. Sowell

ATTORNEY.

July 28, 1970 H. J. TANCREDI 3,521,953

ADJUSTABLE SEPARATION WAFER CLAMP

Filed March 13, 1968 6 Sheets-Sheet 2

INVENTOR.
Henry J. Tancredi

BY John B. Sowell

ATTORNEY.

July 28, 1970 H. J. TANCREDI 3,521,953

ADJUSTABLE SEPARATION WAFER CLAMP

Filed March 13, 1968 6 Sheets-Sheet 3

INVENTOR.
Henry J. Tancredi

BY John B. Sowell
ATTORNEY.

ADJUSTABLE SEPARATION WAFER CLAMP

Filed March 13, 1968 6 Sheets-Sheet 4

INVENTOR.
Henry J. Tancredi
BY
John B. Sowell
ATTORNEY.

INVENTOR.
Henry J. Tancredi

BY John B. Sowell
ATTORNEY.

INVENTOR.
Henry J. Tancredi
BY
John B. Sowell
ATTORNEY.

3,521,953
Patented July 28, 1970

3,521,953

ADJUSTABLE SEPARATION WAFER CLAMP

Henry J. Tancredi, Philadelphia, Pa., assignor to Kulicke and Soffa Industries, Inc., Fort Washington, Pa., a corporation of Pennsylvania Filed Mar. 13, 1968, Ser. No. 712,754
Int. Cl. G03b *27/20*
U.S. Cl. 355—78 10 Claims

ABSTRACT OF THE DISCLOSURE

In a mask alignment machine an apparatus for engaging semiconductor wafers of random thickness with a mask exerting a predetermined force to establish a reference plane between the top of the wafer and the bottom of the mask. The apparatus also includes a manually operable selector for predetermining the amount of separation to be imparted between the wafer and the mask for orientation of the wafer to the mask.

BACKGROUND OF THE INVENTION

The present invention constitutes an improvement in prior art contact printing mask alignment apparatus, such as those shown in my U.S. Pat. 3,220,331. In the process of making semiconductor devices it is the present practice to deposit or diffuse different layers of material on, or into, semiconductor wafers. Selective areas of the diffused wafer, and/or the deposits, are etched away by the well known photo-resist process in a series of steps to produce a large number of semiconductor devices on a single wafer. Wafers are of the order of one to two inches in diameter and when processed may have several hundred to several thousand semiconductor devices thereon. Thus, the individual semiconductor device may be as small as a few thousandths of an inch long and wide, having electrodes or individual indicia thereon measured in a few ten-thousandths of an inch.

An average semiconductor device may require as few as four, or as many as twenty-five individual photo-resist steps employing different masks. Each successive mask pattern must coincide in exact registration relative to the partially processed wafer pattern, otherwise the pattern loses its dimensional accuracy.

Heretofore, masks having highly accurate patterns on optically-flat glass plates have been employed to photographically transfer mask patterns to semiconductor wafers. The wafer may have been substantially flat after being sliced from an ingot and polished, however, after being processed in a high temperature diffusion furnace, it becomes distorted. The waves or distortions may be so great that an ordinary attempt to flatten the wafer into surface-to-surface contact with a mask will crack the fragile wafer and/or bend the mask.

The thickness of a wafer can best be described as non-uniform because of variations in thickness between semiconductor wafers, variations in the thickness of different areas on the same wafer, and the distortions which result from processing a wafer. It is well known that a wafer is best oriented to the pattern on a mask when it is closed to the mask. Attempts to place the wafer too close to the mask risk the chance that the photo-resist material will be harmed during orientation resulting in sub-standard products and low yield. Prior art mask alignment devices have allowed for separation between the wafer and the mask, but have not provided a structure which would provide automatic and repeatable separation on distorted wafers of random thickness. Prior art devices exerted large forces on the wafer during the clamping operation prior to separation of the wafer and the mask; this has resulted in variable compression of distorted wafers and variable separation.

SUMMARY OF THE INVENTION

The present invention overcomes the limitation of the prior art by providing means for adjusting the amount of separation between a random thickness wafer and a mask. A vertically movable chuck carrier is adapted to engage a wafer with a mask. A chuck carrier having low mass is independently movable in a vertical guide. The power drive means for raising the chuck carrier drives through yielding means cooperating with cam means and a slider so that the wafer is engaged with the mask by the force of the yielding means. After the wafer is engaged with the mask, the cam means and slider are connectable together as a unit to be moved in a reverse direction to lower the chuck carrier and separate the wafer from the mask. A manually adjustable selection device is provided which will predetermine the amount of movement of the power drive means, which in turn will predetermine the amount of movement of the chuck carrier. Adjustment of the selection device effects a predetermined repeatable separation between a random thickness wafer and a mask.

These and other features, objects and advantages of the invention will become apparent in connection with the following description of the details of a preferred construction read in conjunction with the accompanying drawings.

DESCRIPTION OF THE PREFERRED EMBODIMENT

Figure 1:
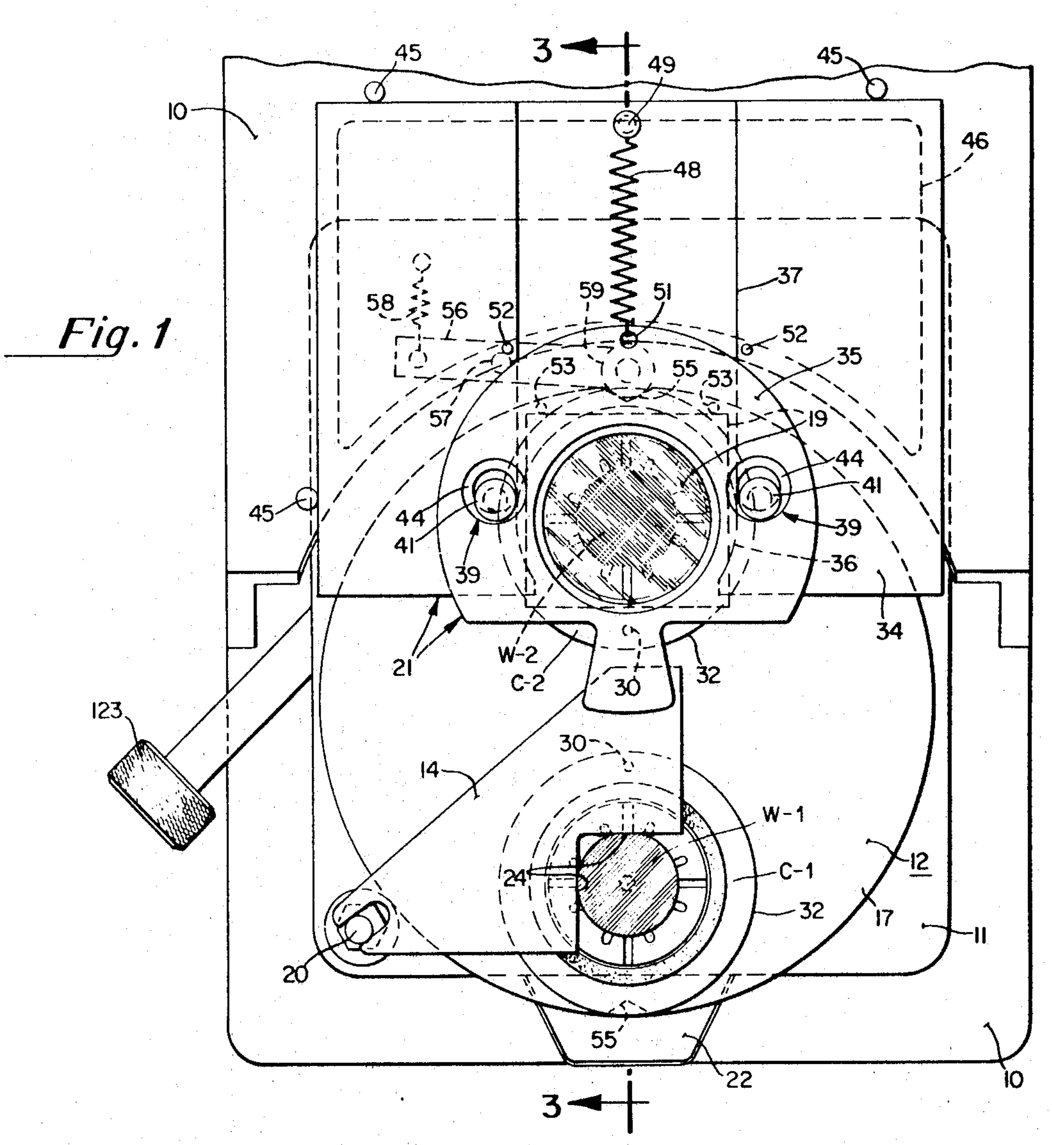
FIG. 1 is a plan view of the chuck holder and mask assembly.
Figure 2:
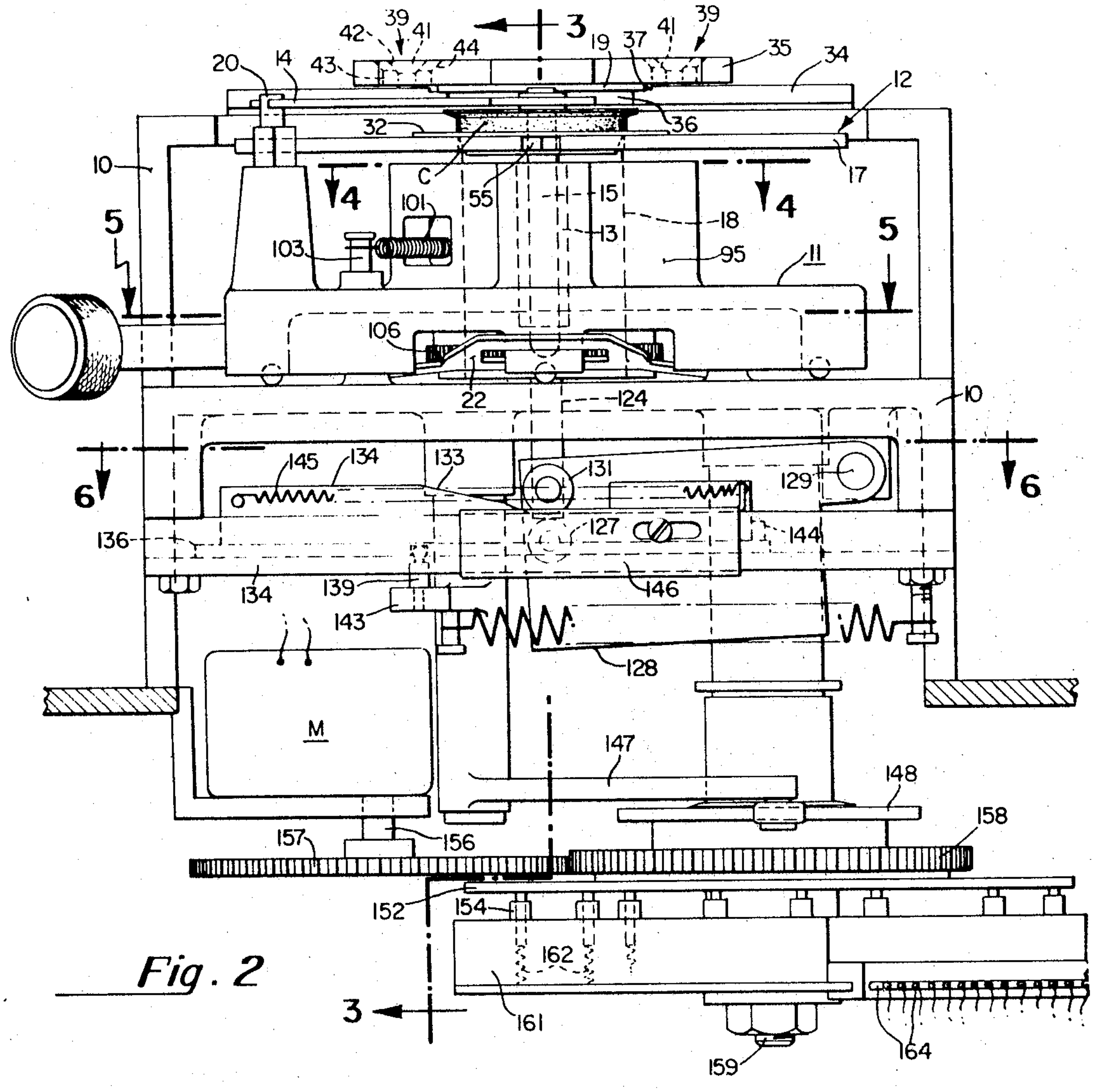
FIG. 2 is a front elevation of the apparatus shown in FIG. 1.
Figure 7:
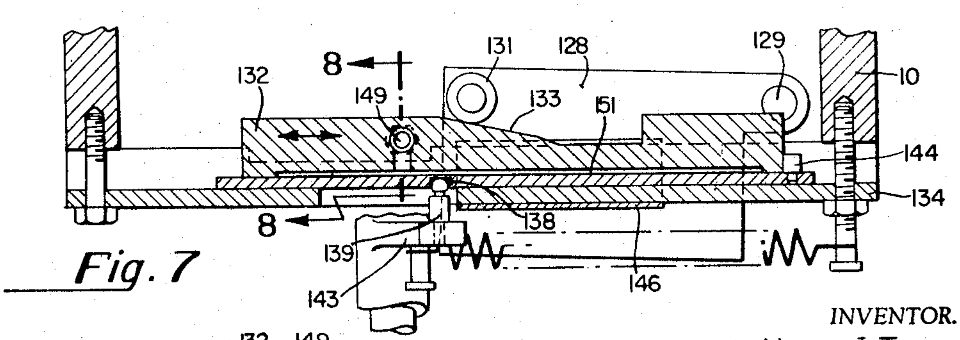
FIG. 7 is a vertical section through the chuck carrier lifting mechanism taken at lines 7—7 of FIG. 3.
Figure 3:
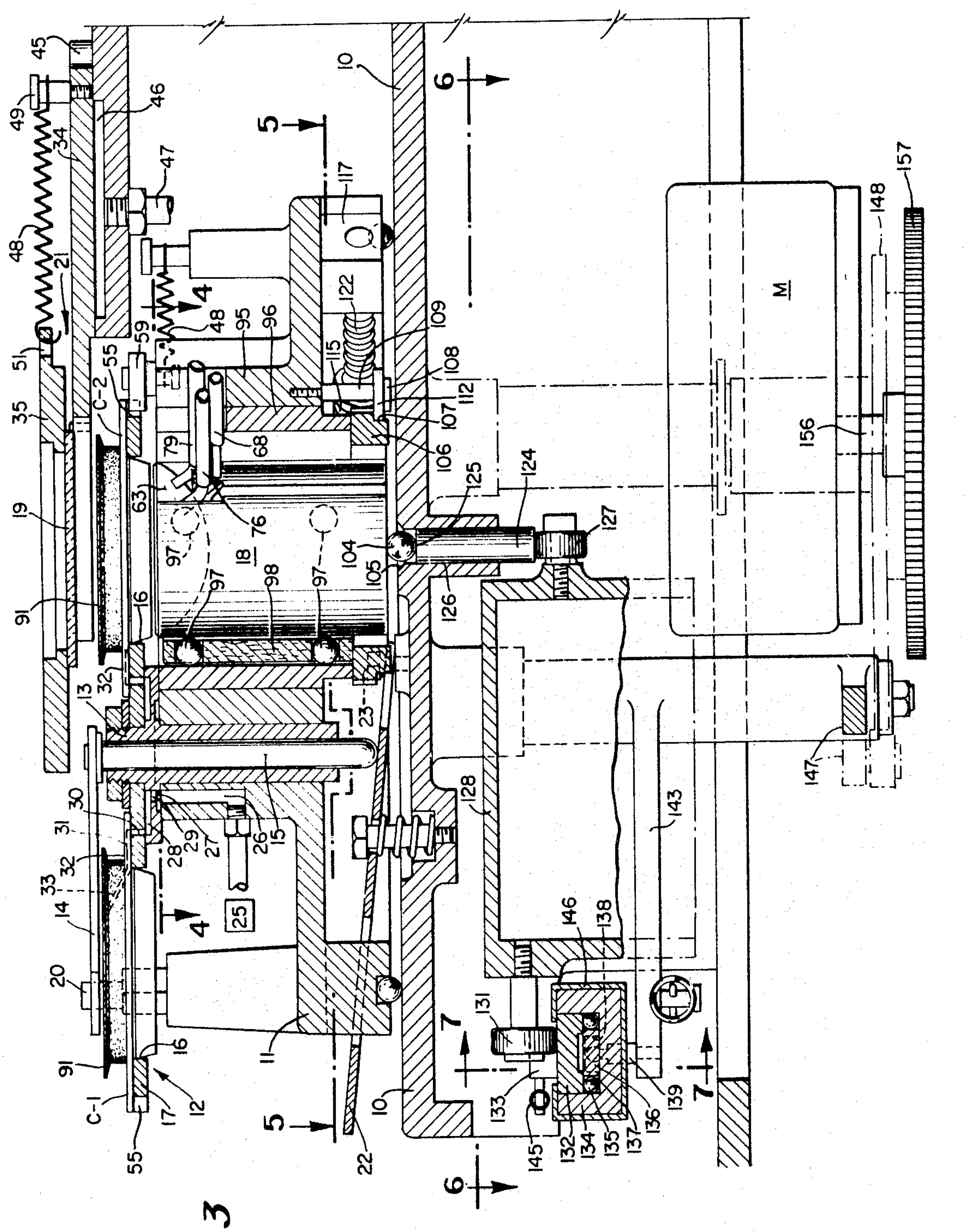
FIG. 3 is an enlarged vertical section taken at lines 3—3 of FIG. 2 with the chuck carrier in its lower position.
Figures 4, 5:
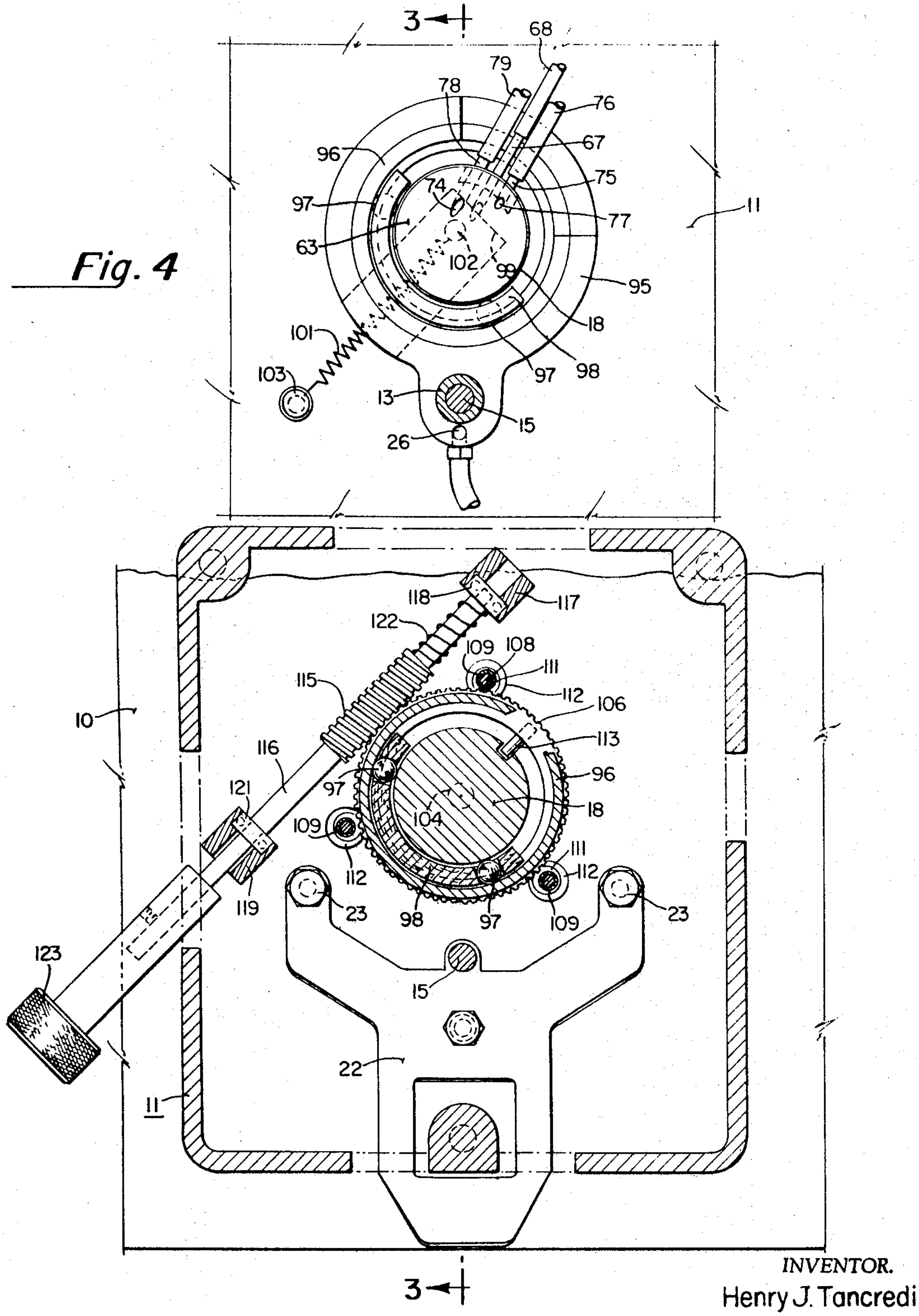
FIGS. 4 to 6 are horizontal sections taken at lines 4—4, 5—5 and 6—6 of FIGS. 2 and 3.

Referring now to FIGS. 1 to 3 of the drawings, showing part of the fixed base 10 of a mask alignment machine upon which is movably mounted a work station 11. The work station 11 is preferably moved by a well known pantograph-type micro-positioner (not shown) to reduce the X–Y movement proportional to the power of the microscope used to observe the movement of a wafer W. Chuck server 12 is pivotally mounted in work station 11 by a hollow bushing 13. Prealignment station 14 is vertically movably mounted through hollow bushing 13 by pin follower 15. Chuck server 12 carries two chucks C–1 and C–2 mounted in apertures 16 of the turntable 17. Chuck C–2, as shown in FIG. 3, is normally positioned intermediate chuck carrier 18 and the mask 19 which is carried in a mask holder 21. Mask holder 21 is detachably connected to the base 10 which remains fixed, however, chuck server 12, prealignment station 14, wafers W, chucks C, and chuck carrier 18, are mounted in or on work station 11 to move simultaneously with movement of the work station 11 and relative to the mask 19.

In the preferred mode of operation wafer W–2, having been prealigned by station 14, is rotated 180° on turntable 17 to its position intermediate mask 19 and chuck carrier 18. Work station 11 is then moved to align the wafer W–2 on chuck C–2 in proper X–Y orientation with the mask 19. When wafer W–1 is prealigned on chuck C–1, it is located 180° away from the now properly oriented wafer W–2, thus, the prealignment station 14 locates wafer W–1 in alignment with the pattern on mask 19, even though remote from the mask.

Station 14, though vertically movable on pivot pin follower 15, is pivotally restricted by eccentric adjustment pin 20 guided in a slot cut in the station 14. Pin follower 15 of the station 14 is resting on a lowering plate 22 which is pivotally mounted by pins 23 to base 10. Plate 22 is normally biased in an upper position, as shown in FIG. 3, so that the prealignment station 14 is normally clear of the wafer W on a chuck C. To prealign a wafer on a chuck, the lowering plate 22 is manually depressed permitting the weight of station 14 to rest on the chuck C. A wafer is picked up with tweezers or a vacuum pencil and urged into engagement with the vertical seat 24 on the station 14. To facilitate positioning and orientation of a wafer, a flat portion is machined on the ingot from which the wafer is cut. Once a wafer is placed on chuck C, it is held in place by an independent continuous vacuum source 25 connected to the work station 11 at passageway 26, which leads to an annular recess 27 in hollow bushing 13. A second annular recess 28 in the bushing 13 is connected to the first recess 27 by holes 29. A hole 30 in the chuck server 12 is connected to an annular recess 31 in the flange 32 of wafer chuck C. A plurality of passageways 33 leads from the annular recess 31 to the surface of the chuck C, thus, holding wafer W in place in any rotational position of the chuck server 12.

Mask holder 21 comprises a mask frame 34 and a clamping ring 35 which hold a mask 19. Mask frame 34 is a rectangular plate having a circularly-shaped aperture 36 therein, slightly larger than the diameter of the top of a chuck C. A slot 37, slightly larger than a mask 19, is machined across the upper surface of the mask frame 34 and provides a support ledge around the circular aperture 36. The depth of the slot 37 is not as deep as the thickness of a mask 19 so that a mask seated in the slot 37 has its upper surface exposed above the surface of the mask frame. Clamping ring 35 has a circular aperture 38 therein slightly larger than the largest wafer W to be processed. Clamping pins 39, as shown in FIG. 2, are connected to the mask frame 34 and extend therefrom to provide flared heads 41 forming inclined cams 42. Stop holes 43 in the clamping ring 35 are countersunk to provide inclined cams 44. The cooperation of cams 42, 44 tends to urge the clamping ring 35 toward the mask frame 34 to clamp a mask 19 therebetween.

Removable frame 34 is accurately positioned on the fixed bridge of the base 10 by three alignment pins 45 in the bridge. A recessed plenum 46 in the bridge is connected to a vacuum source, such as source 25, at connection 47 to provide means for holding the mask frame to the bridge. Removable clamping ring 35 is urged rearwardly, as shown in FIGS. 2 and 3, by resilient means, such as spring 48, connected between a pin 49 on the mask frame 34 and a hole 51 in the clamping ring 35. When a mask 19 is being inserted or removed, the clamping ring 35 is removed from engagement with clamping pins 39 and allowed to rest on top of the flared heads 41 with the rear edge engaging the stop pins 52. In this position clamping ring 35 is displaced far enough from the mask slot 37 to permit easy removal or insertion of a mask. Mask 19 is positioned relative to circular aperture 38 in the mask frame 34 by guide pins 53 extending from the frame 34 high enough to engage a mask 19 without engageing the clamping ring.

The slot 37 in the mask frame 34 and the guide pins 53 serve to accurately locate individual mask 19. When the mask 19 is properly positioned in the mask holder, the pattern thereon is accurately positioned relative to base 10. Wafers W are accurately positioned at prealignment station 14 and then rotated 180° to a position below and opposite the mask 19. To assure accurate roation of the chuck server 12 which carries a wafer W on a chuck C, notches 55 are provided in the server which cooperate with a positioner lever arm 56 centrally pivoted on pin 57 mounted on work station 11. One end of lever arm 56 is biased by spring 58 to urge the follower 59 into engagement with a notch 55.

Figure 9:
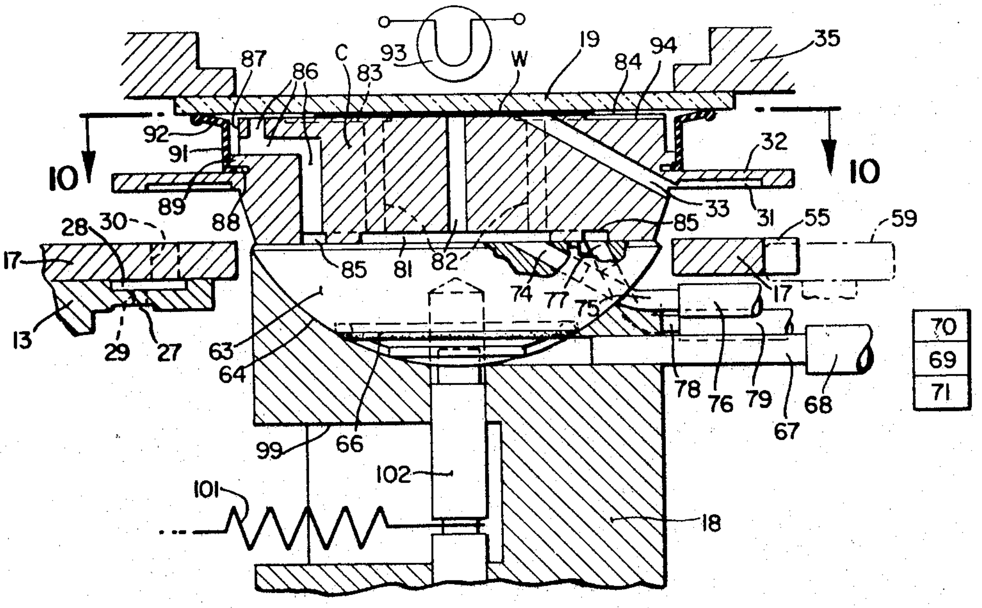
FIG. 9 is an enlarged vertical section showing details of the wafer chuck and chuck carrier.
Figure 10:
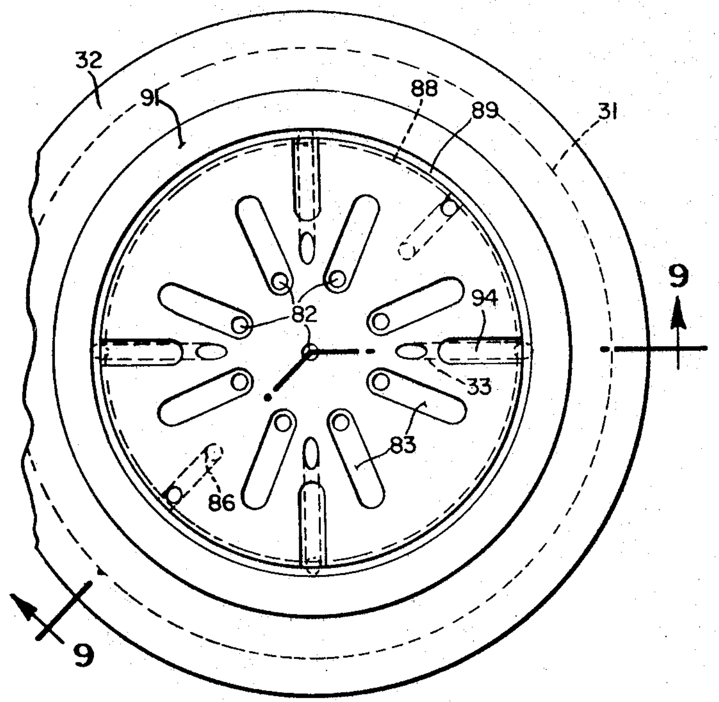
FIG. 10 is a plan view of the removable wafer chuck taken at lines 10—10 of FIG. 9.

In the process of making a plurality of semiconductors on a wafer W it is necessary to orient each pattern on the mask with the partial geometric pattern already on the wafer by orienting the wafer while in very close proximity to, but not touching, the mask. During contact printing or exposure of the photo-resist material on the wafer, the mask and the wafer are in face-to-face contact, preferably in an optically flat plane. FIGS. 2 and 3 show the wafer chuck C supported by and resting on the turntable 17. FIG. 9 shows the wafer chuck C engaging a wafer W against a mask 19 with the wafer chuck C lifted out of aperture 16 in the turntable 17 by chuck carrier 18. Chuck carrier 18 comprises a half ball 63 movably mounted in socket 64 of a chuck seat 65 which acts as a lifting piston for the half ball 63 and the wafer chuck C. In the preferred embodiment shown, the half ball 63 is lapped and polished in the socket 64 to provide an air-tight seat therebetween. Half ball 63 is truncated, providing a plenum 66 in the bottom of the socket which is connected by a metal tube 67 to a flexible tube 68 which further communicates with a source of compressed air 69 and a vacuum source 71. The manner in which alternate sources of air and vacuum may be supplied at tube 67 is well known and has not been shown. It is readily understood that, when air under pressure is supplied to the plenum 66, the half ball 63 will float on a film of air, and when a vacuum is created at the plenum 66, the half ball 63 becomes locked in the socket 64. The half ball 63 has a smooth machined top surface 72 which engages a smooth machined bottom surface 73 of the chuck C to form a vacuum seal therewith. A first passageway 74 in the half ball 63 is connected by a rigid tube 75 and a flexible tube 76 to a vacuum source 71. A second passageway 77 in the half ball 63 is connected by a rigid tube 78 and a flexible tube 79 to a source of inert gas 70 and a vacuum source 71. The first passageway 74 terminates at a circular recess or plenum 81 in the bottom surface 73 of the wafer chuck C. Plenum 81 is connected to the top surface of wafer chuck C by nine holes 82, best shown in FIG. 10. The outer rings of holes 82 terminate into outwardly extending shallow recesses 83 in the smooth machined top surface 84 of the wafer chuck C. The second passageway 77 terminates at an annular recess or plenum 85 in the bottom of the chuck C. Plenum 85 is connected by two cross-drilled passageways 86 to the top surface 84 and the side 87 of the wafer chuck C. A radial groove 88 is provided in the side of chuck C intermediate the flange 32 and a radial ring 89. A Z-shaped resilient ring seal 91 is fitted at one end of the Z into the radial groove 88 and forms a seal with the side 87 of the chuck. The free end 92 of the Z normally extends vertically beyond the top surface 84 of the chuck C and wafer W thereon, thus, the free end of the seal 91 will form a very light compressive seal with the mask 19 when the chuck C is raised to engage the wafer W with the mask 19.

When a wafer W is placed on the chuck C and rotated into position intermediate the mask 19 and the chuck carrier 18, the wafer W is being held in place on the chuck by a vacuum source 25 acting through passageway 33 and recess 31. However, when the chuck carrier 18 lifts the chuck C out of the turntable aperture 16, the vacuum hold is terminated. As the chuck carrier 18 lifts the wafer chuck C, the vacuum source 71 acting through passageway 74, plenum 81 and holes 82 is connected to the bottom of the wafer W.

In the preferred mode of operation, a wafer W is lightly engaged against the mask 19 while the half ball 63 is floating on an air film, thus, aligning the top 72 of the half ball 63 parallel to the surfaces 73, 84 of the chuck C and the bottom of the wafer W. While the top of wafer W is engaged with the mask 19, the half ball 63 is locked to the socket 64 of the chuck seat 65. Chuck C and wafer W are then lowered a predetermined distance from the mask 19 to orient the wafer. During the orientation operation an inert gas is supplied through passageways 77 and 86 to purge air in the space bounded by the chuck C, the mask 19, and the resilient seal 91. The pressure of the inert gas is sufficient to force gas past the seal so as to flush the air from around the wafer, however, there is some reverse flow past the wafer into holes 82, to which a vacuum source 71 is connected, which assures removal of the air.

After the wafer W is oriented relative to the mask 19, the wafer W is again raised into engagement with the mask. The inert gas supplied through passageways 77 and 86 is shut off and a vacuum source, such as source 71, is connected. This additional source of vacuum acting at the outer perimeter of the wafer chuck C is sufficient to eliminate substantially all the gas around the wafer. The wafer W is clamped between the mask 19 and the wafer chuck C with a force of approximately 13 pounds per square inch acting uniformly over the exposed upper surface of the mask. It will be appreciated that, had a force of this magnitude been applied by the chuck carrier 18 acting against the mask 19, the mask 19 would have been deformed. The mechanical force acting on the chuck carrier to raise the wafer W in engagement with the mask 19 is usually limited to approximately three pounds. Wafer sizes have tended to increase with improvements in technology, presently some wafers are made about three inches in diameter. Large wafers have a tendency to deform or distort more than small wafers when processed in a diffusion furnace; the ability to clamp large wafers with large forces acting uniformly against the opposite side of a mask greatly enhances the ability to press the wafer flat against the chuck so that small accurate patterns can be produced. Small patterns permit more semiconductors to be made on a wafer or alternatively, permit higher yields through consistent reproduction of patterns. Maintaining the mask and wafer flat by uniform pressure applied to the mask has less tendency to break a wafer which is distorted and permits more accurate reproduction of mask patterns. While the wafer W is substantially in optically flat contact with the mask 19 in an inert gas environment, the photoresist surface on the wafer is exposed to a light source 93. No oxidation or reaction between the inert gas and the photoresist surface occurs which could effect the development process.

FIGS. 2 to 5 show the structure for guiding, supporting and rotating the chuck carrier 18 in the bearing frame portion 95 of the work station 11. A hardened steel sleeve 96 is press-fitted into the cast iron bearing frame 95 to provide an accurate vertical cylindrical wall for four balls 97 held in ball separator or retaining means 98. The two sets of balls 97 are separated by an arc of approximately 120°, and the ball separator 98 extends circumferentially beyond the balls only far enough to hold them securely. The chuck seat 65 is spring-biased to entrap the balls 97 between the cylindrical walls of the chuck seat 65 and the hardened sleeve 96. A recess 99 is cut into the side of the chuck seat to provide access for spring 101 connected to eccentrically located pin 102. The other end of spring 101 connected to a pin 103 on the work station 11 urges the chuck seat 65 counterclockwise and engages all four balls simultaneously; additional balls could be employed but are not required to maintain true vertical and horizontal position when the chuck is rotated. The recess 99 is large enough to permit vertical and rotary movement of the chuck seat 65 without touching spring 101. Chuck seat 65 is vertically supported by a ball 104 laterally restrained in a recess 105. A ring gear 106 having a step shoulder 107 is supported by three shallow head machine screws 108, each provided with a spacer 109, and an eccentric bushing 111 cooperating with a small ball bearing 112. The outer race of the ball bearing 112 engages the horizontal and vertical surface of shoulder 107 to position and support the ring gear 106. A pin 113 in the ring gear extends radially inward into a long vertical slot 114 in the side of the chuck seat 65 so that rotary movement of the ring gear 106 is coupled to the chuck seat 65. The ring gear 106 engages a worm gear 115 mounted on a long shaft 116 extending free of the work station 11. Bearing block 117 supports a thrust-type bearing 118 pressed therein to support shaft 116. Bearing block 119 has a similar bearing 121 pressed therein to support the other end of the shaft 116. The long shaft 116 with the worm gear 115 thereon is spring-biased by spring 122 toward bearing 121 to prevent axial movement of the shaft.

When the knurled handle end 123 of the shaft 116 is manually rotated, worm gear 115 rotates the ring gear 106 causing pin 113 to rotate. Either pin 113 rotates the chuck seat clockwise or the eccentric action of pin 102 and spring 101 causes the chuck seat to follow the movement of pin 113. Rotation of chuck seat 65 will rotate half ball 63, wafer chuck C and wafer W thereon. The apparatus shown is capable of rotating the chuck seat 65 through an arc of approximately 120°, however, it is not necessary to rotationally align a wafer with a pattern on a mask by more than a few degrees.

Figure 8:
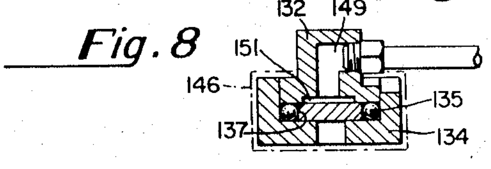
FIG. 8 is a vertical section taken at lines 8—8 of FIG. 7.
Figure 6:
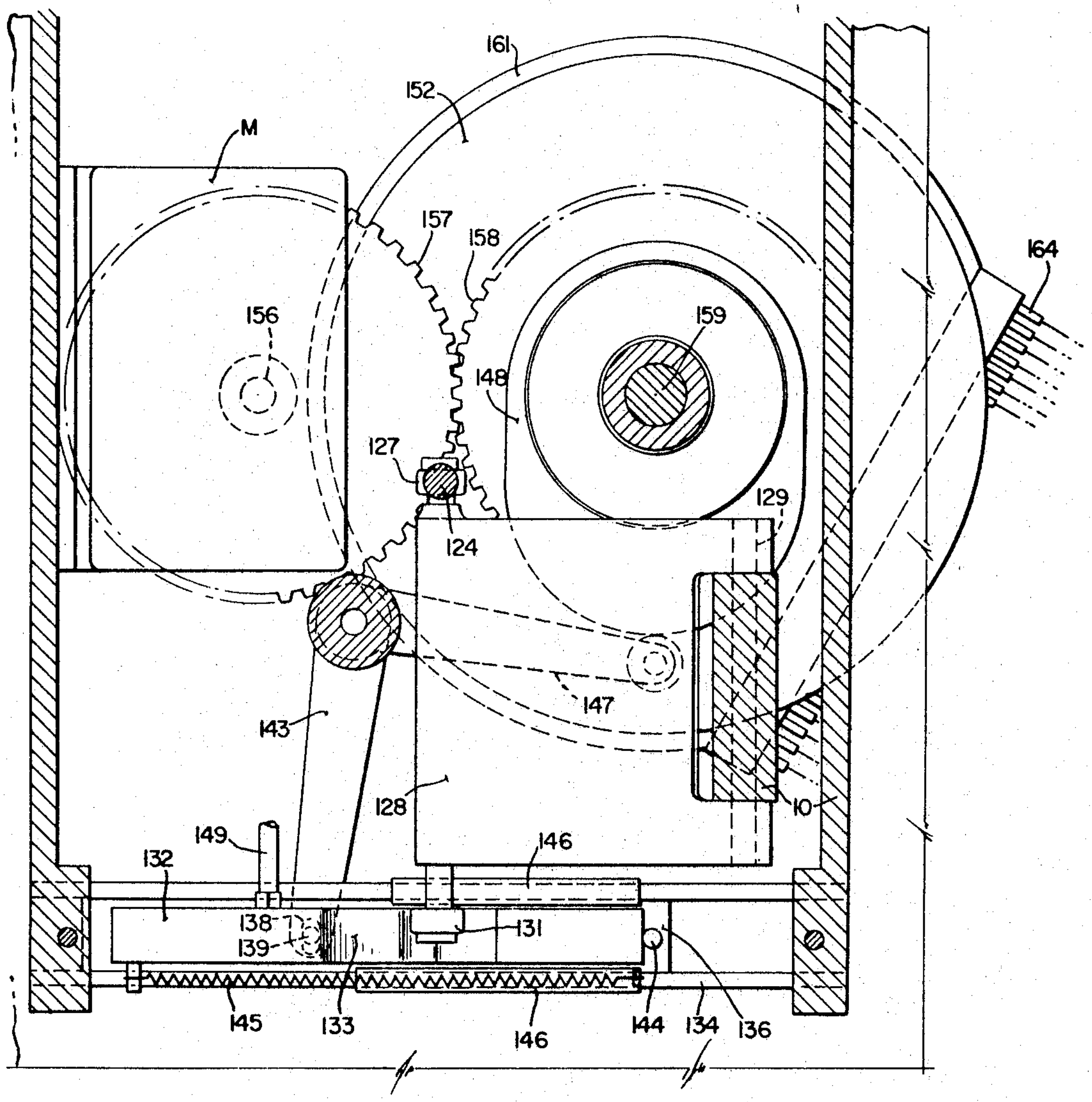

FIGS. 2 to 3, 6 to 9 and 11 to 12 show the structure for raising and lowering the chuck seat 65 to engage the wafer W with the mask 19, and for automatically separating a wafer W from the mask 19 a predetermined distance independent of the thickness of the wafer. Ball 104, supporting the chuck seat 65, is resting on a hard pin 124. As best shown in FIGS. 2 and 6, pin 124 is vertically slidably mounted in aperture 126 of base 10 and resting upon a roller 127 mounted on pivot arm 128. Pivot arm 128 is mounted on fixed base 10 by a long pin 129 and is pivotally movable through a small arc by cam follower or roller 131 mounted on the pivot arm 128. Roller 131 is moved through a vertical arc by a wedge 132 having an inclined cam 133 thereon. The wedge 132 is slidably mounted in a U-shaped housing or wedge track 134 which is affixed to the base 10, as best shown in FIGS. 3 and 8. Balls 135 support the wedge 132 in the track 134 at its outer margins. Below the wedge 132 is a slider 136 in the form of a slotted rectangular plate slightly thinner than the diameter of the balls 135 which are retained in longitudinal and transverse alignment by longitudinal slots 137 in the edge of plate 136. A transverse slot 138 in the bottom of slider 136 receives the ball end of a pin 139. Pin 139 extends downwardly from the slider 136 through a slot 141 in the wedge track 134 and is fixedly mounted in the end 142 of wedge drive arm or lever arm 143. Lever arm 143, when actuated by the main drive, imparts a controlled reciprocating motion to a slider 136. If the slider 136 is moving to the left in FIGS. 6 and 7, a raised stop or pin 144 on the slider 136 engages the end of the wedge 132 and moves it to the left to lower roller 131 which in turn lowers the wafer W on the chuck C. When the lever arm 143 is in its leftmost position in FIGS. 2, 6 and 7, the chuck seat 65 and half ball 63 are in their lowest position. As lever arm 143 returns to the right, slider 136 and pin 144 thereon are moving away from the wedge 132, however, spring 145 connected between wedge 132 and wedge track 134 urges the wedge to follow the slider. As the wedge 132 moves to the right, roller 131 engages cam 133, causing the chuck C and wafer W to be raised. After the wafer W touches the mask 19, the lifting assembly stops because spring 145 can no longer drive the roller 131. The main drive or power means is free to continue moving lever arm 143 and slider 136 to the right by stretching spring 145 without substantially increasing the force on the wafer or the mask. One end of spring 145 is connected to the wedge track 134 through an adjustable anchor 146 so that critical tension adjustments may be imparted to the spring 145. Spring 145 may be selected and adjusted so that a few ounces to several pounds force is exerted by the chuck C on the wafer W and the mask 19.

When lever arm 143 in its rightmost position, pin 144 on slider 136 is moved away from the wedge 132 and the spring 145 forces the roller 131 to its highest vertical position on cam 133. Slider 136 is moved to its extent of rightward movement by follower arm 147 acting on the lowest part of cam 148, which occurs between 110° and 145°. While slider 136 is in its rightmost position, it is affixed to wedge 132 by means of a vacuum source (not shown) acting through a passageway 149 in the wedge 132 connected to a shallow plenum 151. After clamping slider 136 to wedge 132, the two move together under control of lever arm 143 driven by follower arm 147 and cam 148. As cam 148 continues to rotate, a rise in the cam occurs between 145° and 220° which will now move the wedge 132 and its inclined cam 133 to the left causing the wafer W to be lowered from the mask.

Figure 12:
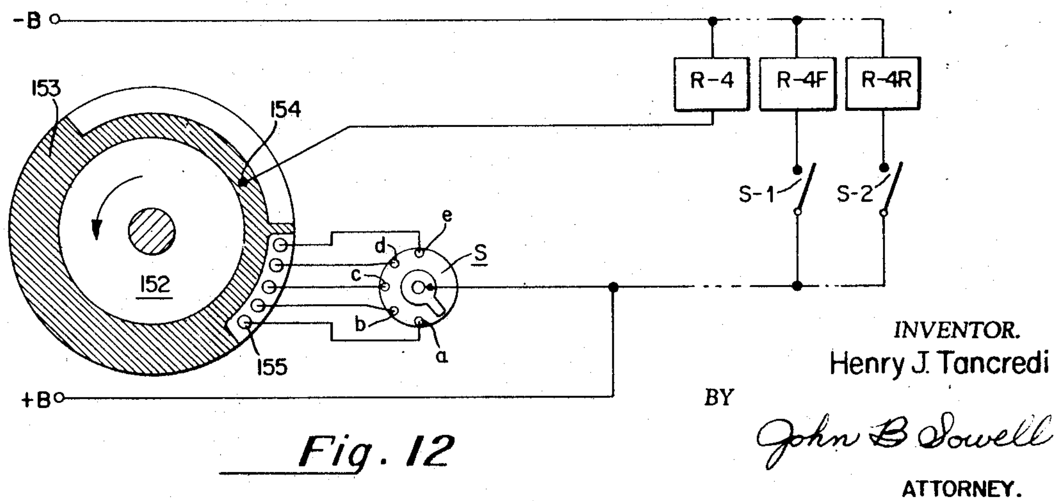
FIG. 12 is a schematic of a wiring diagram and printed circuit for limiting the movement of the chuck carrier.

The manner in which a predetermined degree of rotation of cam 148 may be selected is explained with reference to the schematic representation in FIG. 12. Printed circuit cam 152 has a conductive area thereon, designated as area 153. A conductive brush 154 is connected through a relay R–4 to one side B− of a power source. The other side B+ of the power source is connected to the center top of a selector switch S having a plurality of selectable positions *a* to *e*. Relay R–4 is connected in a well known manner to energize the drive motor M which rotates the printed circuit cam 132. When the selector switch S is connected to position *a*, cam 132 will be rotated by drive motor M until conductive area 153 passes under brush 155 and disconnects the power from relay R–4, which in turn stops the drive motor M. Switches S–1 and S–2 illustrate means of connecting relays R–4F and R–4R to the power source so that forward and reverse operation of the drive motor M may be achieved independent of the selector switch circuit.

It will be understood that selector switch S can be set to any of a plurality of positions representative of various degree-setting of brushes cooperating with printed circuit cam 152, and that the cam 152 will rotate to the brush connected to the selected position, whereupon the relay R–4, in series with the conductive area of the cam, will be deenergized, thus, stopping the motor which drives the cam.

Figure 11:
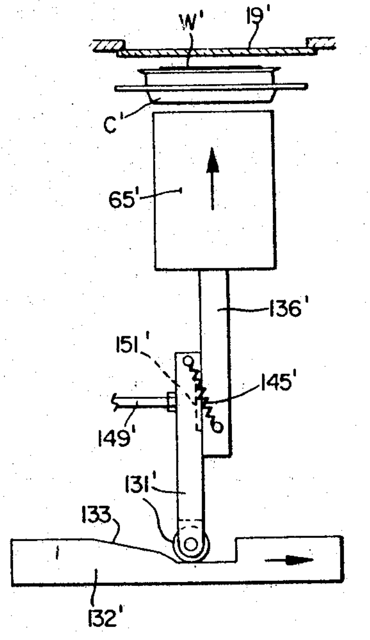
FIG. 11 is an elevation of a schematic representation of another chuck carrier lifting mechanism.

The manner in which the adjustable separation feature is achieved may be made more clear by reference to a modified embodiment shown in FIG. 11. Wedge 132′, if driven to the right, will cause cam follower 131′ to be raised by cam 133′. Spring 145′ raises slider 136′ which in turn forces the chuck carrier 65′ to engage chuck C′ and engage the wafer W′ with the mask 19′. The greatest force which can be exerted on the mask 19′ is limited by spring 145′. The slider 136′ and cam follower 131′ are connected by vacuum means 149′, 151′ while the wafer engages the mask. As already explained, cam 148 is then rotated a predetermined number of degrees by the printed circuit selection means so that wedge 132′ is moved to the left a predetermined increment indicative of the separation desired between the wafer and the mask.

FIGS. 2 to 3 and 5 to 6 show the power means comprising the drive motor M, printed circuit cam 152 etc. Drive motor M is housed in the base 10 and has a downwardly extending drive shaft 156 connected to a driving gear 157 meshed with driven gear 158 which rotates main shaft 159. Main shaft 159 also has connected thereto cam 148 and printed circuit cam 152. Cam 148 actuates follower arm 147 and lever arm 143 which raises and lowers the wafer-carrying chuck C. Printed circuit cam 152 is engaged by a plurality of brushes, like brushes 154, 155, to achieve predetermined increments of separation between the wafer W and the mask 19. It is to be understood that other logical functions, such as opening and closing valves and timing sequences of operation may be performed by cam 152. Brushes 154, 155 are slidably mounted in an insulation board 161 and spring-biased by conductive springs 162 to engage the printed circuit cam 152. A fixed printed circuit board 163 is affixed to the bottom of the insulation board 161 and forms electrical connections to the springs 162. The fixed printed circuit board 163 is preferably provided with a plug-in terminal board 164 to facilitate wiring connections.

Having explained in detail the operation of the preferred embodiment structure, other structures and modifications of this structure will suggest themselves to those skilled in the art; it being understood that the objects of this invention are: To prealign a wafer at an external station on a separate chuck while exposing another wafer on a second chuck in the mask alignment machine; to transfer the prealigned wafer into the machine juxtaposed the mask; to engage the prealigned wafer with the mask in plane-to-plane parallel alignment with a predetermined force; to separate the wafer from the mask a predetermined increment; to align the wafer with the mask while in close proximity therewith; to purge the area around the wafer with inert gas; to re-engage the now aligned wafer with the mask and clamp the wafer to the mask by vacuum clamping to achieve uniform forces acting on the mask; to expose the clamped wafer; and to lower the wafer-carrying chuck into the turntable so that the steps may be repeated.

I claim:

1. In a mask alignment machine a device for positioning a semiconductor wafer relative to a mask comprising: a base, a frame for supporting a mask on said base, a work station mounted on said base for horizontal movement relative thereto, a chuck carrier mounted for vertical and rotary movement relative to said work station, a wafer chuck for supporting a wafer, said wafer chuck being engageable by said chuck carrier to impart rotary and vertical motion thereto for positioning a wafer and for engaging a wafer with a mask, cam means for raising and lowering said chuck carrier to a predetermined position relative to said mask, a slider connectable to said cam means, and yielding means biasing said cam means and said slider together and being operable to limit the force applied to said wafer when engaging a mask.

2. A device for positioning a semiconductor wafer relative to a mask as set forth in claim 1, which further includes power drive means for moving said cam means and said slider as a unit until the wafer chuck has engaged the wafer against the mask, the maximum excursion of said power drive means imparting relative movement between said slider and said cam means.

3. A device for positioning a semiconductor wafer relative to a mask as set forth in claim 2, which further includes locking means for connecting said slider to said cam means after said slider and said cam means have been moved relative to each other by the maximum excursion of said power drive means.

4. A device for positioning a semiconductor wafer relative to a mask as set forth in claim 3, which further includes an adjustable selector operable to select the amount of excursion imparted by said power drive means to the connected slider and cam means, and to control downward movement of said wafer chuck, said selector permitting selection of the amount of separation between a random thickness wafer and a mask.

5. A device for positioning a semiconductor wafer relative to a mask as set forth in claim 4, wherein said adjustable selector comprises an electrical switch having a plurality of selectable positions.

6. A device for positioning a semiconductor wafer relative to a mask as set forth in claim 5, wherein said adjustable selector further comprises a printed circuit disk rotatable by said power drive means and cooperable with said electrical switch to limit the excursion of said power drive means.

7. In a mask alignment machine a device for positioning a semiconductor wafer relative to a mask comprising, a base, a frame for supporting a mask on said base, a work station mounted on said base for horizontal movement relative thereto, a chuck carrier including a wafer chuck mounted for vertical and rotary movement relative to said work station for supporting a wafer juxtaposed said mask, a ring gear mounted on said work station for rotary movement relative thereto, means connecting said ring gear and said chuck carrier for imparting rotary motion to said chuck carrier, screw means cooperating with said ring gear for rotating said ring gear and said chuck carrier, means for moving said chuck carrier vertically to engage said wafer with said mask, and guide means intermediate said chuck carrier and said work station for guiding rotary and vertical movement of the chuck carrier relative to said work station.

8. A device for positioning a semiconductor wafer relative to a mask as set forth in claim 7, which further includes an eccentric pin affixed off-center in said chuck carrier and a spring connected to said eccentric pin operable to rotationally force said chuck carrier against said means connecting said ring gear and said chuck carrier to eliminate the backlash between said chuck carrier and said screw means.

9. A device for positioning a semiconductor wafer relative to a mask as set forth in claim 7, wherein said guide means include spring means for urging said chuck carrier horizontally into engagement with said work station.

10. A device for positioning a semiconductor wafer relative to a mask as set forth in claim 9, wherein said guide means comprise at least four balls disposed in pairs in a ball retainer, said ball retainer comprising an arcuate segment separating said pairs of balls by an included angle of approximately one hundred and twenty degrees.

References Cited

UNITED STATES PATENTS

| | | | |
|---|---|---|---|
| 3,192,844 | 7/1965 | Szasz et al. | 355—78 |
| 3,220,331 | 11/1965 | Evans et al. | 355—78 |
| 3,306,176 | 2/1967 | Myers | 355—91 |

NORTON ANSHER, Primary Examiner

R. L. MOSES, Assistant Examiner

U.S. Cl. X.R.

355—87, 91